(12) United States Patent
Nishitani et al.

(10) Patent No.: US 6,455,950 B1
(45) Date of Patent: Sep. 24, 2002

(54) CIRCUIT CONNECTION STRUCTURE OF AUTOMOBILE DOOR

(75) Inventors: Keizo Nishitani; Yasuyoshi Serizawa, both of Susono (JP)

(73) Assignee: Yazaki Corporation, Tokyo (JP)

( * ) Notice: Subject to any disclaimer, the term of this patent is extended or adjusted under 35 U.S.C. 154(b) by 125 days.

(21) Appl. No.: 09/596,376

(22) Filed: Jun. 16, 2000

(30) Foreign Application Priority Data

Jul. 5, 1999 (JP) .......................................... 11-190810

(51) Int. Cl.$^7$ ................................................ B60L 1/00
(52) U.S. Cl. ........................ 307/10.1; 439/34; 174/72 A
(58) Field of Search ........................... 307/10.1; 49/67, 49/76.1, 77; 361/736, 748, 749, 785, 790, 792; 439/34, 557, 931, 248; 174/72 A

(56) References Cited

U.S. PATENT DOCUMENTS

| | | | | |
|---|---|---|---|---|
| 4,800,648 A | * | 1/1989 | Nakayama et al. | 174/72 A |
| 4,818,236 A | * | 4/1989 | Nakayama et al. | 439/34 |
| 4,824,164 A | * | 4/1989 | Nakayama et al. | 174/72 A |
| 4,848,829 A | * | 7/1989 | Kidd | 174/72 A |
| 4,869,670 A | * | 9/1989 | Ueda et al. | 174/72 A |
| 4,907,836 A | * | 3/1990 | Ueda et al. | 174/72 A |
| 4,943,109 A | * | 7/1990 | Skrbina et al. | 174/72 A |
| 5,442,149 A | * | 8/1995 | Sato | 200/293 |
| 5,460,530 A | * | 10/1995 | Toba et al. | 174/72 A |
| 5,513,077 A | * | 4/1996 | Stribel | 174/72 B |
| 5,846,091 A | * | 12/1998 | Nishijima et al. | 174/72 A |
| 6,000,949 A | * | 12/1999 | Takiguchi et al. | 174/72 A |
| 6,031,184 A | * | 2/2000 | Ichikawa et al. | 174/72 A |
| 6,036,501 A | * | 3/2000 | Wojewnik et al. | 439/34 |
| 6,142,556 A | * | 11/2000 | Tanaka et al. | 174/72 A |

FOREIGN PATENT DOCUMENTS

| | | | | |
|---|---|---|---|---|
| JP | 8-230585 | | 9/1996 | |
| JP | 2001-39238 | * | 2/2001 | B60R/16/02 |

* cited by examiner

*Primary Examiner*—Fritz Fleming
*Assistant Examiner*—Roberto J. Rios
(74) *Attorney, Agent, or Firm*—Morgan, Lewis & Bockius LLP

(57) ABSTRACT

A standard circuit unit 20 for controlling standard electronic equipment (such as a power window drive mechanism), mounted on a door trim 10, is separate from an optional circuit unit 30 for controlling an optional electronic equipment (e.g. a power seat-adjusting mechanism) optionally mounted on the door trim. A switch circuit board 22, 32 is integrally formed in a predetermined pattern on an extension of an input/output signal conductor portion 22b, 32b of an FPC body of each of the two circuit units 20 and 30. First and second electric connectors 25 and 26, provided respectively at distal ends of the input/output signal conductor portions 22b and 32b, can be combined together with a one-touch operation, and operating signals are inputted from a door control unit via these electric connectors so as to output switch signals for effecting the on-off control of the electronic equipments. When the kind of car is changed, only the optional circuit unit 30 is easily exchangeably combined with the already-mounted standard circuit unit 20.

16 Claims, 5 Drawing Sheets

CIRCUIT CONNECTION STRUCTURE OF AUTOMOBILE DOOR

BACKGROUND OF THE INVENTION

1. Technical Field

The present invention relates to a circuit connection structure of an automobile door, mounted on a door trim of the automobile door, for controlling the various electric equipment, such as a power window mechanism.

2. Related Art

Various electronic equipments are mounted on a door trim which is an interior cover plate of a door panel of a car, and examples of such electronic equipments include: a power window drive mechanism for automatically opening and closing window glass; a power seat adjusting-mechanism for automatically adjusting the degree of inclination of a driver's seat in accordance with the body build and posture of the driver; and a courtesy lamp mechanism for lighting a lamp in order to warn other running cars of the fact that a door of the car, stopped or parked at night, is open. The electronic equipment is connected directly or via an inner panel-side wire harness to a door control unit (ECU: electronic control unit).

Since the wire harness including wires or cables for feeding control signals to the electronic equipment is installed in a space or gap between the door panel and the door trim, the installing operation may be effected with a blind operation, and requires much time and labor. Therefore, there is a problem to reduce the time and labor required for the installation of the wire harness, when the electronic equipment is mounted on the car door. Recently, instead of wire harnesses including wires and cable, FPCs (flexible printed circuit board), have drawn attention, and have been extensively used. Such FPC (flat circuit member) is thin, lightweight and flexible, and can be arranged and installed efficiently.

FIG. 5 is a perspective view showing a door wire harness (a conventional flat circuit member including a FPC disclosed in JP 8-230585A) as seen from the inside of the passenger room of the car.

In this case, the flat circuit member 3 is installed in a space between a reverse side of a door trim 2 and a door panel 1. One end of the flat circuit member 3 is connected via electric connectors 4, 5 and 6 to respective switch units which output switch signals for effecting the on-off control of electronic equipment including a power window drive mechanism, a courtesy lamp mechanism and a power seat-adjusting mechanism. An electric connector 7 for inputting operating signals from the body side is mounted on the other end of the flat circuit member 3.

In the flat circuit member 3 as shown in FIG. 5, if the power window drive mechanism and the courtesy lamp mechanism are standard electronic equipment including a standard circuit and if the power seat-adjusting mechanism is an optical electric equipment including an optional circuit, the standard circuit and the optional circuit are formed integrally with each other and formed into a single circuit construction.

Therefore, the conventional technique, disclosed in the above publication, has the following problems:

(1) The single flat circuit member 3, including an FPC, is of such a construction that the standard circuit and the optional circuit are formed integrally with each other. Therefore, when the optional electronic equipment is changed in accordance with a change of the kind of car, this flat circuit member can not meet such switch layout change, and the whole of the flat circuit member, including the standard circuit, must be reformed, and this is uneconomical.

(2) The single flat circuit member 3 is extended and installed so that the electronic connectors 4, 5, 6 and 7, mounted on the one and other ends of the single flat circuit member 3, can be located adjacent respectively to the corresponding electronic equipment and switch units. Therefore, the overall length of the flat circuit member 3 is naturally large. If the circuit becomes longer, the risk of cutting of wires during the installation of the flat circuit member becomes higher. Therefore in view of this, the width of the circuit member must be increased in accordance with the increased length thereof in order to secure the necessary strength of the circuit member. As a result, the flat circuit member 3 has the excessively large width, which is uneconomical.

(3) When the flat circuit member 3 is long and wide, this is liable to cause a malfunction in a very weak-current circuit.

(4) When the flat circuit member 3 is long and wide, it is also necessary to protect and fix the important intermediate part of the circuit members 3 by protective casings. The use of such protective casings increases the number of the component parts and the time and labor for the assembling operation, and besides the short-circuiting of the circuit is liable to be caused by the protective casing.

(5) Each of the switch units of the electronic equipment, to which the flat circuit member is connected via the electric connectors 4, 5, 6 and 7, includes an electric circuit of a conventional construction formed by lead wires. Therefore, it is very cumbersome to connect the flat circuit member (FPC) 3 to this electric circuit. A connector structure is provided at this circuit-connecting portion, and therefore the number. of the component parts increases, and also the operation becomes complicated. Therefore, generally, the electronic equipment circuit can not be simplified, and the production cost and the assembling cost can not be reduced.

It is therefore an object of this invention to provide a circuit connection structure of an automobile door in which the mounting operation can be simplified and can be effected efficiently by simplifying the whole of the installed circuit to reduce to a minimum length in a way that the circuit for controlling standard electronic equipment and the circuit for controlling an optional electronic equipment are provided as separate, independent units, respectively.

SUMMARY OF INVENTION

The above object of the invention has been achieved by a circuit connection structure for various electric equipments mounted on a door trim of an automobile door, comprising:

a standard circuit unit including a first flexible printed circuit board provided with a first electric connector for connecting to another circuit, and said standard circuit unit including a first switch circuit member for controlling a standard electric equipment; and an optional circuit unit including a second flexible printed circuit board provided with a second electric connector for connecting to another circuit, and said optional circuit unit including a second circuit.

In this construction, the standard circuit unit for controlling the standard electronic equipments and the optional circuit unit for controlling the optional electronic equipment are provided as separate units, respectively. Therefore, when the kind of car is changed, only the optional circuit unit can be easily exchanged, and can be post-mounted. In the conventional standard circuit/optional circuit-integral type, even the standard circuit is removed from the door trim although this standard circuit itself does not need to be removed. In the structure of the invention, however, such uneconomical operation is eliminated, and the operation for mounting the structure on the door trim is reduced, so that the efficiency can be enhanced.

In the invention, the optional circuit unit, corresponding to the selected kind of car, is exchangeably mounted on the door trim, and is combined with the already-mounted standard circuit unit in such a manner that the first and second electric connectors can be easily combined together by recess-projection fitting.

In this construction, when the kind of car is changed, the second electric connector, provided at the optional circuit unit, is combined with the first electric connector, provided at the already-mounted standard circuit unit, with a one-touch operation by recess-projection fitting, and by doing so, this structure can be handled easily-when connecting the electric connectors to the other circuit such as a door control unit (ECU; electronic control unit), and the efficiency of the assembling operation is enhanced.

In the invention, the first switch circuit member is integrally formed in a predetermined pattern on the first flexible printed circuit board, and the second switch circuit member is integrally formed in a predetermined pattern on the second flexible printed circuit board.

The conventional switch circuit members are in the form of a lead wire circuit, and therefore the complicated connector structure, as well as much time and labor, has been required for connecting this lead wire circuit to the flexible printed circuit board (body). In the invention, since the first and second switch circuit members are integrally formed in their respective patterns on the first and second flexible printed circuit boards, respectively, the provision of the connector structure is omitted, and the time and labor for this operation is saved.

In the invention, the standard electronic equipment is a power window mechanism and a courtesy lamp mechanism while the optional electronic equipment is a power seat mechanism, and the optional circuit unit for controlling the power seat mechanism is post-mounted on the door trim, and is combined with the standard circuit unit already mounted on the door trim.

In this specific example, the optional circuit unit for controlling the power seat-adjusting mechanism can be post-mounted on the door-trim, and can be combined with the already-mounted standard circuit unit for controlling the power window drive mechanism and the courtesy lamp mechanism.

BRIEF OF THE DRAWINGS

DETAILED DESCRIPTION OF THE PREFERRED EMBODIMENT

Figure 1:
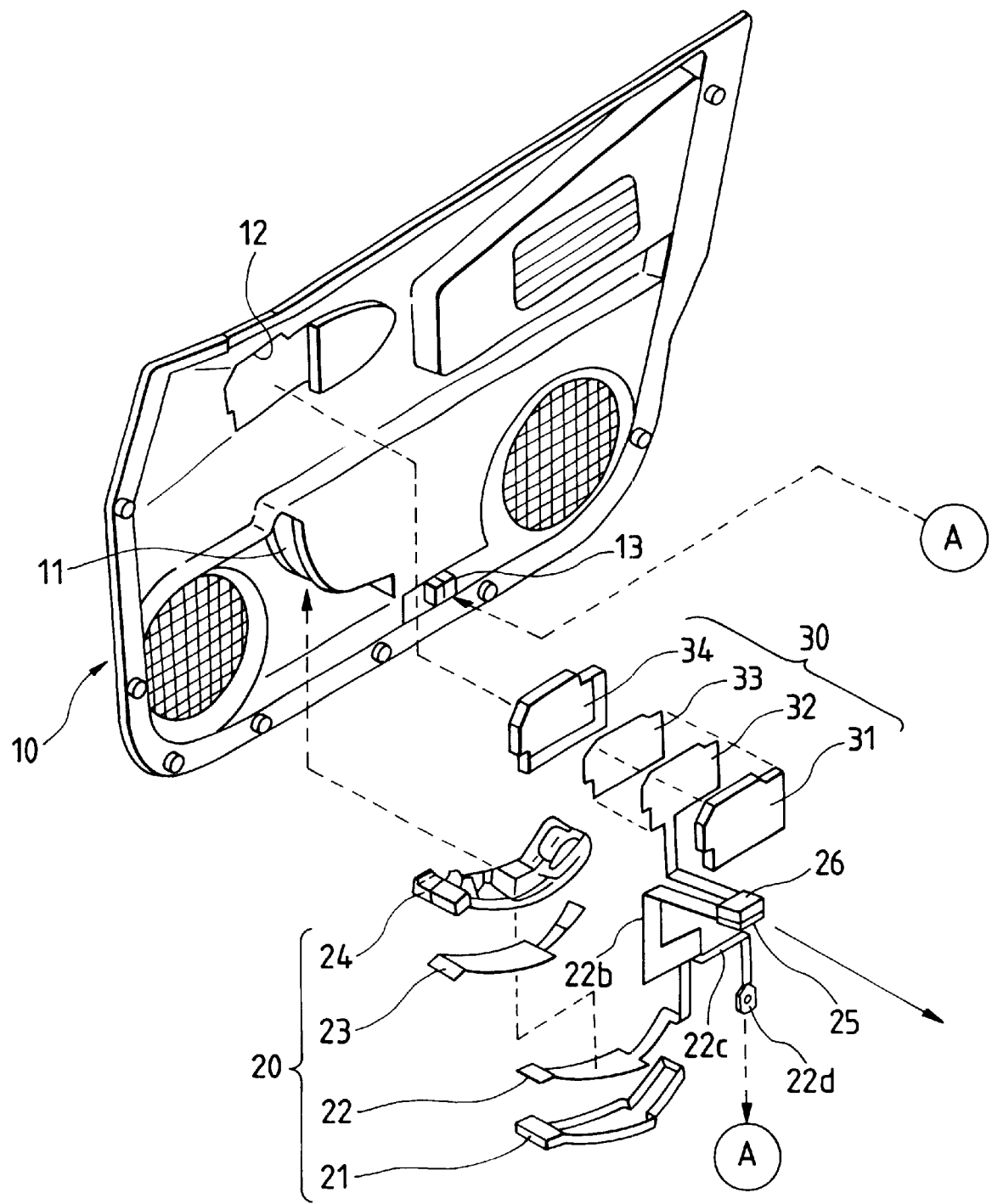
FIG. 1 is an exploded, perspective view showing a preferred embodiment of a circuit connection structure of an automobile door, provided in accordance with the invention, as well as a door trim.

A preferred embodiment of a circuit connection structure of an automobile door of the invention will now be described in detail with reference to the drawing.

Figure 5:
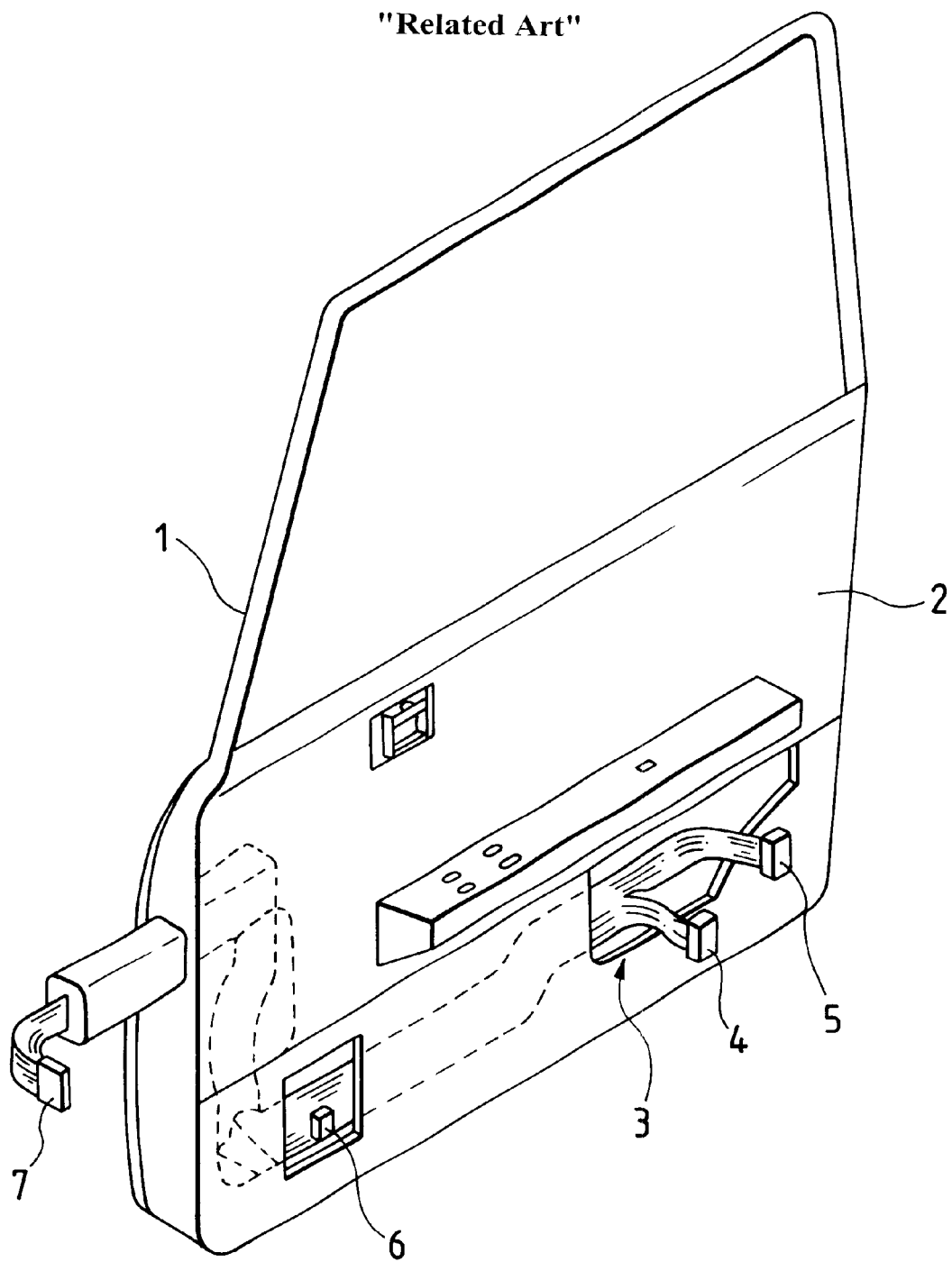
FIG. 5 is a perspective view showing a conventional circuit connection structure of an automobile door.

FIG. 1 is an exploded, perspective view of the circuit connection structure of this embodiment mounted on a reverse side of a door trim 10. In this embodiment, the circuit connection structure is designed to connect a power window drive mechanism (not shown), a power seat-adjusting mechanism (not shown) and a courtesy lamp mechanism 13, as described above for the conventional structure of FIG. 5. In the case where the power window drive mechanism and the courtesy lamp mechanism 13 are standard electronic equipment, a standard circuit unit 20 includes a first flexible printed circuit board (FPC) (which forms a circuit for controlling these mechanisms) on which a first switch circuit member 22 is integrally formed in a predetermined pattern. In the case where the power seat-adjusting mechanism is an optional electronic equipment, an optional circuit unit 30 includes a second flexible printed circuit board (which forms a circuit for controlling this mechanism) on which a second switch circuit member 32 is integrally formed in a predetermined pattern.

Figure 3:
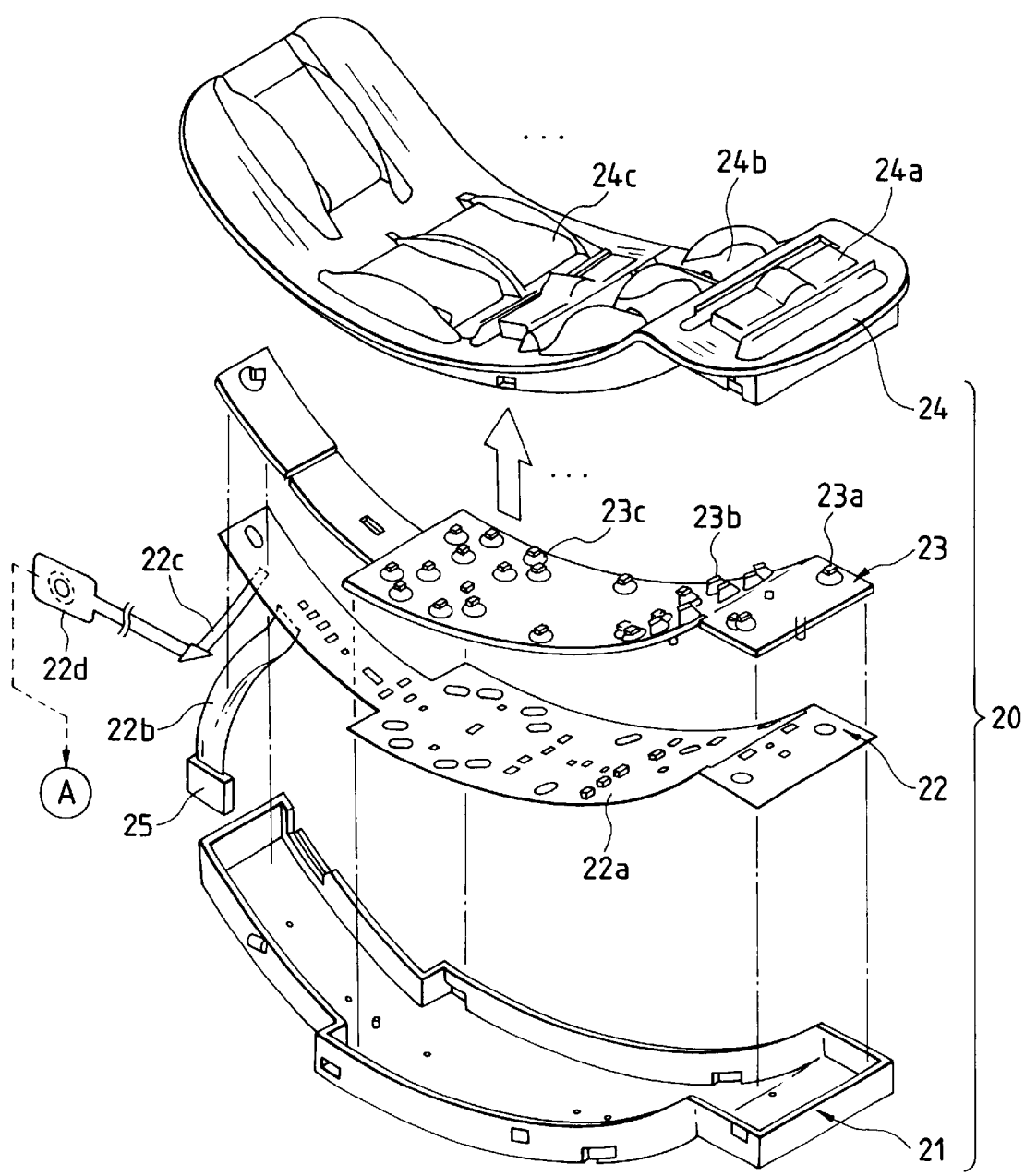
FIG. 3 is an exploded, perspective view showing the construction of the standard circuit unit.

As shown in FIG. 3, the standard circuit unit 20 comprises the following members. The unit includes a lower casing 21 which is molded of a resin, and is formed into a curved shape. The lower casing 21 is fixedly secured to a curved recess portion 11 in the door trim 10 by screws or the like. The unit includes the switch circuit board 22 which forms the first switch circuit member and is received in the lower casing 21. The switch circuit board 22 is a flexible printed circuit board which is made, for example, of polyethylene terephthalate (PET), and has a circuit pattern formed thereon.

A rear end portion of a body 22a of the switch circuit board 22 is connected to an input/output signal conductor portion 22b which forms the first flexible printed circuit board. With respect to the technical concept of the present invention, the input/output signal conductor portion 22b, which is the first flexible printed circuit board, forms a large proportion of the overall length of the circuit. It may be considered that the switch circuit board 22 of the predetermined circuit pattern is formed integrally on an extension of the input/output signal conductor portion 22b.

A first electric connector 25 (shown in FIG. 2) is connected to a distal end of the input/output signal conductor portion 22b forming the first flexible printed circuit board. A switch on-off signal is inputted from the switch circuit board 22 via the first electric connector 25 to a door control unit (which is referred to as "other circuit" in the invention), and a control signal is fed from this door control unit to the power window drive mechanism. An input/output signal conductor portion 22c, which also forms the first flexible printed circuit board, is connected to the rear end portion of the circuit board body 22a. A lamp circuit board (first switch circuit member) 22d for connection to the courtesy lamp mechanism 13 is formed at a distal end of the input/output signal conductor portion 22c. In FIG. 1, the connection between the lamp circuit board 22d and the courtesy lamp mechanism 13 is indicated by broken lines A.

The standard circuit unit 20 also includes a rubber contact 23 which is received in the lower casing 21 in superposed relation to the switch circuit board 22. A plurality of convex contacts 23a, 23b, 23c, . . . are formed integrally on the rubber contact 23, and can be elastically brought into and out of contact respectively with switch terminals on the circuit pattern formed on the switch circuit board 22.

The standard circuit unit further includes a switch knob cover (upper casing) 24 which covers the rubber contact 23. The switch knob cover 24 is a resin-molded product, and has various key tops 24a, 24b, 24c, . . . corresponding to the convex contacts 23a, 23b, 23c, . . . formed on the rubber contact 23, and these key tops can be pressed by the passenger.

As is clear from the foregoing, in the standard circuit unit 20, when a desired one of the key tops 24a, 24b, 24c, . . . on the switch knob cover 24 is depressed, the convex contact 23a, 23b, . . . of the rubber contact 23 (underlying the switch knob cover 24), corresponding to the depressed key top, is depressed by this key top, so that the circuit of the switch circuit board 22, underlying the rubber contact, is turned on or off. Namely, the switch circuit board 22, provided on the extension of the input/output signal conductor portions 22b and 22c, outputs the switch signals for effecting the on-off control of the standard electronic equipment (that is, the power window drive mechanism and the courtesy lamp mechanism 13).

Figure 4:
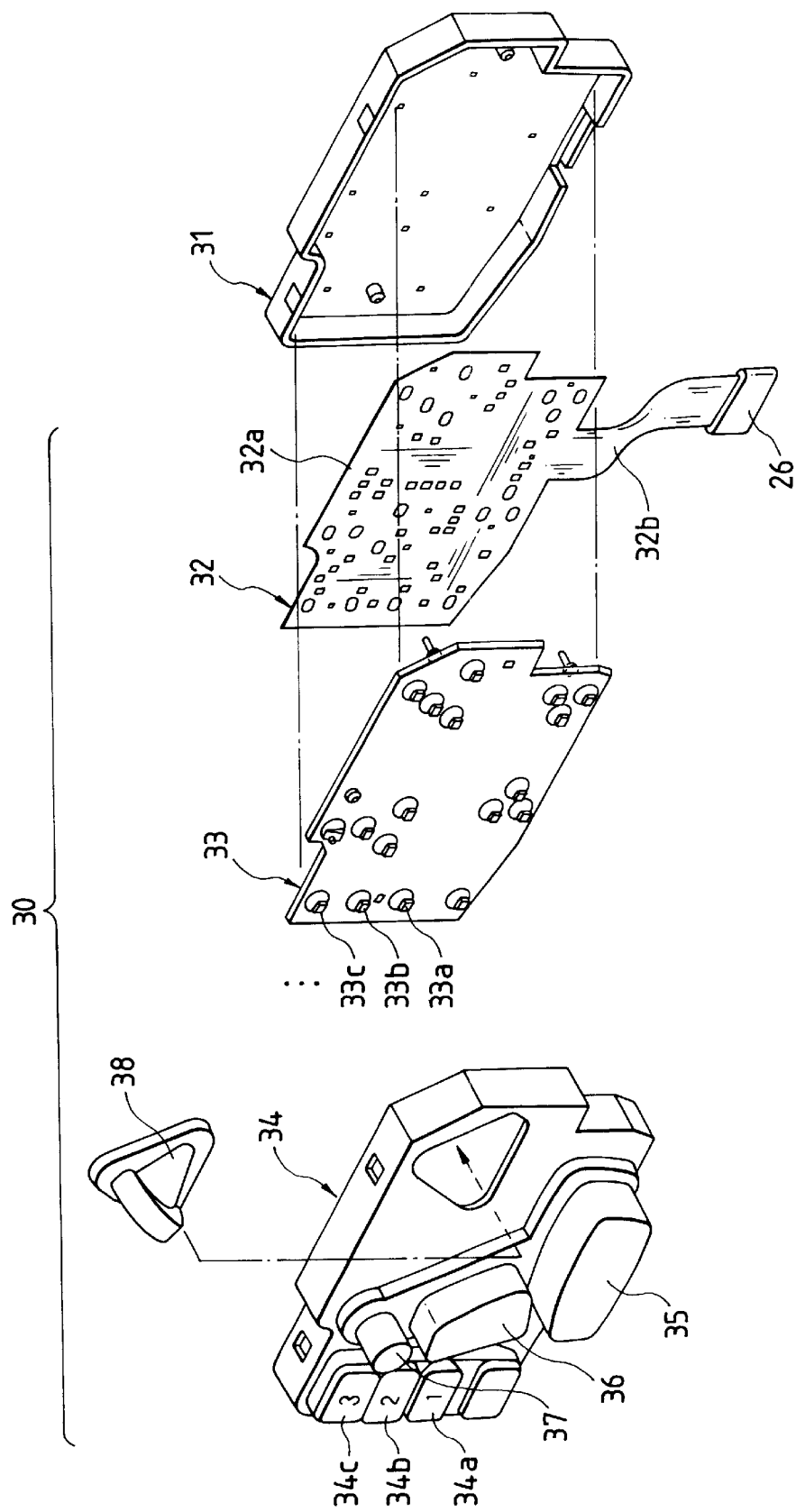
FIG. 4 is an exploded, perspective view showing the construction of the optional circuit unit.

As shown in FIG. 4, the optional circuit unit 30 includes the following members. The unit includes a back casing 31 molded of a resin, and this back casing 31 is fixedly mounted in a mounting window 12, formed in the door trim 10, by press-fitting or the like. The unit includes the switch circuit board 32, which forms the second switch circuit member and is received in the back casing 31. This switch circuit board 32 is a flexible printed circuit board which is made, for example, of polyethylene terephthalate (PET), and has a circuit pattern formed thereon.

A rear end portion of a body 32a of the switch circuit board 32 is connected to an input/output signal conductor portion 32b which forms the second flexible printed circuit board. With respect to the technical concept of the present invention, as described above for the standard circuit unit 20, the input/output signal conductor portion 32b forming the second flexible printed circuit board forms a large proportion of the overall length of the circuit. It may be considered that the switch circuit board 32 with the predetermined circuit pattern is formed integrally on an extension of the input/output signal conductor portion 32b.

A second electric connector 26 (shown in FIG. 2) is connected to a distal end of the input/output signal conductor portion 32b which forms the second flexible printed circuit board. A switch on-off signal is inputted from the switch circuit board 32 via the second electric connector 26 to the door control unit, and a control signal is fed from this door control unit to the power seat-adjusting mechanism. Namely, the switch circuit board 32 outputs, via the input/output signal conductor portion 32b, the switch signal for effecting the on-off control of the optional electronic equipment (that is, the power seat-adjusting mechanism).

The optional circuit unit 30 includes a rubber contact 33 which is received in the back casing 31 in superposed relation to the front side of the switch circuit board 32. A plurality of convex contacts 33a, 33b, 33c, . . . are formed integrally on the rubber contact 33, and can be elastically brought into and out of contact respectively with switch terminals on the circuit pattern formed on the switch circuit board 32.

The optional circuit unit further includes a switch knob cover (front casing) 34 which covers the front side of the rubber contact 33. The switch knob cover 34 is a resin-molded product, and has various key tops 34a, 34b, 34c, . . . which correspond to the convex contacts 33a, 33b, 33c, . . . formed on the rubber contact 33, and can be pressed by the passenger. A key top 38 for a tilt telescopic switch is also formed on the switch knob cover 34.

As is clear from the foregoing, in the optional circuit unit 30, when a desired one of the key tops 34a, 34b, 34c, . . . on the switch knob cover 34 is depressed, the convex contact 33a, 33b, 33c . . . of the rubber contact 33 (underlying the switch knob cover 34), corresponding to the depressed key top, is depressed by this key top, so that the circuit of the switch circuit board 32, disposed on the reverse side of the rubber contact, is turned on or off, thereby effecting the on-off control of the power seat-adjusting mechanism.

In the optional circuit unit 30, for example, numbers "1", "2" and "3" are indicated respectively on the key tops 34a, 34b and 34c on the switch knob cover 34 as shown in the drawings. In this case, for example, when the driver is seated on-the driver's seat, the posture of the upper half of the body of the driver is stored or memorized with respect to the optimum angle lines of a seat 35 (called "torso line"), a back restraint 36 and a headrest 37. The body build and posture of a first driver are memorized through the key top indicating No. 1, and those of a second driver are memorized through the key top indicating No. 2, and those of a third driver are memorized through the key top indicating No. 3.

Figure 2:
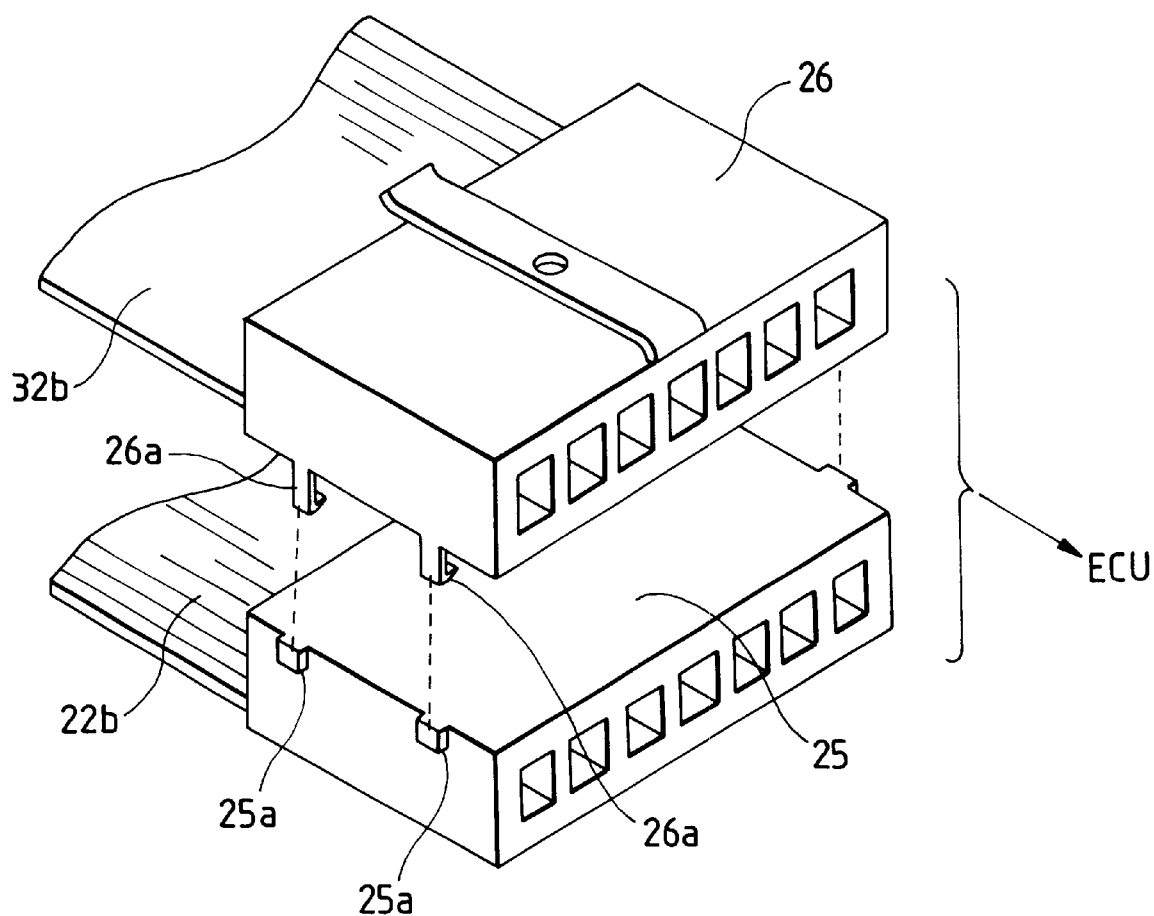
FIG. 2 is a perspective view showing the manner of easily combining an electric connector of a standard circuit unit and an electric connector of an optional circuit unit together so that the thus combined electric connectors can be connected to a door control unit.

FIG. 2 shows the first electric connector 25 provided at the standard circuit unit 20, and the second electric connector 26 provided at the optional circuit unit 30. Engagement recesses 25a are formed in a stepped manner in each of opposite ends of the first electric connector 25 of the standard circuit unit 20. Engagement claw projections 26a, corresponding respectively to the engagement recesses 25a, are formed on the second electric connector 26 of the optional circuit unit 30. The engagement projections 26a can be brought into and out of engagement with the respective engagement recesses 25a with a one-touch operation. The two electric connectors, after combined together by these engagement portions, can be easily electrically connected to the door control unit.

Next, the mounting of the circuit connection structure of this embodiment on the door trim 10, as well as its operation during this assembling operation, will be described.

The standard circuit unit 20 is easily arranged and installed on the door trim 10, with the first electric connector 25 kept in a free condition, so that the standard circuit unit 20 is prepared to be electrically connected to the power window drive mechanism and the courtesy lamp mechanism (which are the standard equipment) and also to the door control unit. This standard circuit unit 20 can be adapted to most of cases where the kind of car is changed, and this unit 20 seldom need to be removed from the door trim.

Then, the separate optional circuit unit 30 is easily arranged and installed on the door trim 10, with the second electric connector 26 kept in a free condition, so that the optional circuit unit 30 is prepared to be electrically connected to the power seat-adjusting mechanism and also to the door control unit.

At the next stage, the first electric connector 25 of the standard circuit unit 20 and the second electric connector 26 of the optional circuit unit 30 are combined or united together with a one-touch operation, with the engagement projections 26a fitted in the engagement recesses 25a (that is, by undercut fitting). The first and second electric connectors 25 and 26, thus combined together, are electrically connected to the door control unit.

As a result, the switch on-off signal can be inputted from the switch circuit board 22 of the standard circuit unit 20 via the first electric connector 25 to the door control unit. The switch on-off signal can be inputted from the switch circuit board 32 of the optional circuit unit 30 via the second electric connector 26 to the door control unit. Namely, the switch signal for effecting the on-off control of the power window drive mechanism and the courtesy lamp mechanism 13 (which are the standard equipment) can be outputted from the switch circuit board 22. The switch signal for effecting the on-off control of the power seat-adjusting mechanism (which is the optional equipment) can be outputted from the switch circuit board 32.

In this assembling operation, the first and second electric connectors 25 and 26 are combined together, and the two connectors are electrically connected to the door control unit. Therefore, the handling efficiency in this connecting operation is far higher as compared with the conventional structure in which the standard circuit and the optional circuit are separately connected to the door control unit. In the conventional structure, the standard circuit and the optional circuit are formed integrally with each other, so that the FPC has the increased length. The electric connectors hang from the opposite ends of this FPC, and this leads to a possibility that the wires in the FPC are accidentally cut during delivery or during the operation. In the wire connection structure of the invention, such a disadvantage is eliminated.

An important feature of this embodiment is that the switch circuit board 22, 32 is integrally formed in the predetermined pattern on the extension of the input/output signal conductor portion 22b, 32b of the FPC body of each of the standard circuit unit 20 and the optional circuit unit 30. Namely, those portions of the conventional structure, corresponding to the switch circuit boards 22 and 32, are in the form of a lead wire circuit, and the connector structure has been required for connecting each of these portions to the FPC. However, in this embodiment, each of such circuits is integrally formed in the required pattern on the FPC. Therefore the use of such connector structures is not necessary, and the number of the component parts is reduced, and particularly the time and labor, required for connecting the wires together, is saved, and the difficulty with the assembling operation is overcome, thereby achieving an advantage that the efficiency can be markedly enhanced.

When the switch layout is changed in accordance with a change of the kind of car, another optional circuit unit 30 which is beforehand prepared for this purpose can be post-mounted in position, and can be combined with the standard circuit unit 20. In the conventional standard circuit/optional circuit-integral type, each time the kind of car is changed, the standard circuit is removed from the door trim although this standard circuit itself does not need to be removed. However, in this embodiment, such unnecessary and uneconomical operation is eliminated.

And besides, in this embodiment, the standard circuit unit 20 and the optional circuit unit 30 are prepared as separate units, respectively. Therefore, on a whole, the length of the electronic equipment circuit is reduced to a minimum the handling during the installing operation is easy, and besides the risk of wire cutting is eliminated. Since the length of the circuit can be reduced to a minimum, it is not necessary to excessively increase the width of the FPC, and this is economical. Furthermore, by keeping the width of the FPC to a minimum, a malfunction will not occur even in the very weak-current circuit. In the conventional structure, when the FPC is long, it is necessary to protect and fix the FPC intermediate the opposite ends thereof by the use of protective casings. However, in this embodiment, the use of such protective a casings is not necessary, and the number of the component parts is reduced, and besides the short-circuiting of the circuit, resulting from the use of such protective casings, is prevented.

In the above embodiment, the circuit connection structure includes the two circuit units, the standard and optional circuit units, the invention can be applied to a circuit connection structure including three or more circuit unit.

As described above, in the invention, the standard circuit unit for controlling the standard electronic equipment and the optional circuit unit for controlling the optional electronic equipment are provided as separate units, respectively. Therefore, when the kind of car is changed, only the optional circuit unit can be easily exchanged, and can be post-mounted. In the conventional standard circuit/optional circuit-integral type, even the standard circuit is removed from the door trim although this standard circuit itself does not need to be removed. However, in the structure of the invention, such uneconomical operation is eliminated, and the operation for mounting the structure on the door trim is reduced, so that the efficiency can be enhanced.

In the invention, when the kind of car is changed, the second electric connector provided at the optional circuit unit is combined with the first electric connector provided at the already-mounted standard circuit unit with a one-touch operation by recess-projection fitting. Therefore, this structure can be handled easily when connecting the electric connectors to the door control unit, and the efficiency of the assembling operation is enhanced.

In the invention, the conventional switch circuit members are in the form of a lead wire circuit, therefore, the complicated connector structure, as well as much time and labor, has been required for connecting this lead wire circuit to the flexible printed circuit board (body). In the invention, since the first and second switch circuit members are integrally formed in their respective patterns on the first and second flexible printed circuit boards, respectively, the provision of the connector structure is omitted, and the time and labor for this operation is saved.

In one specific example, the optional circuit unit for controlling the power seat-adjusting mechanism can be post-mounted on the door trim, and can be combined with the already-mounted standard circuit unit for controlling the power window drive mechanism and the courtesy lamp mechanism. Therefore, there is achieved an advantage that this structure can meet a switch layout change when the kind of car is changed.

What is claimed is:

1. A circuit connection structure for various electric equipments mounted on a door trim of an automobile door, comprising:

a standard circuit unit including a first flexible printed circuit board provided with a first electric connector for connecting to another circuit, and said standard circuit unit including a first switch circuit member for controlling a standard electric equipment; and an optional circuit unit including a second flexible printed circuit board provided with a second electric connector for connecting to another circuit, and said optional circuit unit including a second circuit member for controlling a optional electric equipment.

2. A circuit connection structure according to claim 1, wherein said option circuit unit corresponding to the selected kind of car is exchangeably mounted on said door trim, said second electric connector is engageable with said first electric connector.

3. A circuit connection structure according to claim 1, wherein said first switch circuit member is integrally formed in a predetermined pattern on said first flexible printed circuit board, said second switch circuit member is integrally formed in a predetermined pattern on said second flexible printed circuit board.

4. A circuit connection structure according to claim 1, wherein when said standard electric equipment is a power window mechanism and a courtesy lamp mechanism, and the optional electric equipment is a power seat-adjusting mechanism, said optional circuit unit for controlling said power seat-adjusting mechanism is mounted on the door trim after that said standard circuit unit is mounted on the door trim.

5. A circuit connection structure for various electric equipment mounted on a door trim of an automobile door trim, comprising:

a first circuit unit including a first electric connector and a first circuit member; and a second circuit unit including a second electric connector and a second circuit member;

wherein said first and second circuit units are separately mounted on said door trim, and said first and second electric connectors are engageable so as to be commonly connectable with an electrical unit and are disengageable so as to be independently exchangeable.

6. A circuit connection structure according to claim 5, wherein said first electric connector includes a first one of a claw and recess and said second electric connector includes a second one of a claw and recess, wherein said claw engages said recess.

7. A circuit connection structure according to claim 5, wherein said first circuit member controls a standard electric equipment, said second circuit member controls an optional electric equipment.

8. A circuit connection structure according to claim 7, wherein said standard electric equipment is a power window mechanism and a courtesy lamp mechanism, said optional electric equipment is a power seat-adjusting mechanism.

9. A circuit connection structure according to claim 5, wherein said second circuit unit is mounted on the door trim after that said first circuit unit is mounted on the door trim.

10. A circuit connection structure for mounting on a door trim of an automobile, comprising:

a first circuit unit including a first electric connector, a first signal conductor portion, and a first circuit member, wherein said first electric connector is connected to said first signal conductor portion distal said first circuit member; and a second circuit unit including a second electric connector, a second signal conductor portion, and a second circuit member, wherein said second electric connector is connected to said second signal conductor portion distal said second circuit member, wherein said first and second circuit units are separately mounted on said door trim, and said first electrical connector is contiguous with said second electrical connector.

11. The circuit connection structure according to claim 10, wherein said first electric connector is engageable with said second electric connector.

12. The circuit connection structure according to claim 10, wherein said first electric connector includes a first one of a claw and recess and said second electric connector includes a second one of a claw and recess, wherein said claw engages said recess.

13. The circuit connection structure according to claim 10, wherein said first circuit member controls a power window mechanism.

14. The circuit connection structure according to claim 10, wherein said first circuit member controls a courtesy lamp mechanism and a power window mechanism.

15. The circuit connection structure according to claim 10, wherein said second circuit member controls a power seat-adjusting mechanism.

16. The circuit connection structure according to claim 10, wherein said first circuit unit is mounted on the door trim before said second circuit unit.

* * * * *